(12) United States Patent
Chen et al.

(10) Patent No.: US 10,943,845 B2
(45) Date of Patent: Mar. 9, 2021

(54) THREE-DIMENSIONAL PACKAGING STRUCTURE AND PACKAGING METHOD OF POWER DEVICES

(71) Applicant: Huazhong University of Science and Technology, Wuhan (CN)

(72) Inventors: Cai Chen, Wuhan (CN); Zhizhao Huang, Wuhan (CN); Yuxiong Li, Wuhan (CN); Yu Chen, Wuhan (CN); Yong Kang, Wuhan (CN)

(73) Assignee: Huazhong University of Science and Technology, Wuhan (CN)

( * ) Notice: Subject to any disclaimer, the term of this patent is extended or adjusted under 35 U.S.C. 154(b) by 0 days.

(21) Appl. No.: 16/430,599

(22) Filed: Jun. 4, 2019

(65) Prior Publication Data

US 2019/0287876 A1    Sep. 19, 2019

Related U.S. Application Data (62) Division of application No. 15/843,415, filed on Dec. 15, 2017, now Pat. No. 10,354,937.

(30) Foreign Application Priority Data

Aug. 31, 2017    (CN) .......................... 201710772472.2

(51) Int. Cl.
*H01L 23/36*    (2006.01)
*H01L 25/16*    (2006.01)
(Continued)

(52) U.S. Cl.
CPC .......... *H01L 23/36* (2013.01); *H01L 23/3735* (2013.01); *H01L 23/5387* (2013.01); *H01L 25/16* (2013.01); *H05K 1/0203* (2013.01); *H05K 1/028* (2013.01); *H05K 1/09* (2013.01); *H05K 1/111* (2013.01); *H05K 1/147* (2013.01); *H05K 1/181* (2013.01); *H05K 3/06* (2013.01); *H05K 3/341* (2013.01); *H01L 23/467* (2013.01);
(Continued)

(58) Field of Classification Search
CPC ...................................................... H01L 23/36
See application file for complete search history.

(56) References Cited

U.S. PATENT DOCUMENTS

2006/0108684 A1* 5/2006 Stevanovic ............. H01L 24/49
                                                                257/728
2006/0227504 A1* 10/2006 Chen ..................... H01L 23/467
                                                                361/679.47

(Continued)

*Primary Examiner* — Omar F Mojaddedi
(74) *Attorney, Agent, or Firm* — Maier & Maier, PLLC (57) ABSTRACT

A three-dimensional packaging structure and a packaging method of power devices. The packaging structure includes power devices, direct copper bonded substrates (i.e., DBC substrates), flexible printed circuit boards (i.e., FPC boards), bonding wires, heat dissipation substrates, decoupling capacitors, a heatsink with integrating the fan, shells, and forms a half-bridge circuit structure composed by the power devices. The power circuit structure is optimized, parasitic inductance in the commutation loop is reduced by mutual inductance cancellation, thus overvoltage and oscillation during the power device switching process can be reduced. Additionally, by using the flexible characteristic of the flexible PCB, a three-dimensional packaging structure is formed and power density is improved.

1 Claim, 6 Drawing Sheets

(51) Int. Cl.
*H01L 23/538* (2006.01)
*H05K 1/02* (2006.01)
*H05K 1/11* (2006.01)
*H05K 3/34* (2006.01)
*H05K 3/06* (2006.01)
*H01L 25/07* (2006.01)
*H05K 1/14* (2006.01)
*H01L 23/373* (2006.01)
*H05K 1/09* (2006.01)
*H05K 1/18* (2006.01)
*H01L 23/467* (2006.01)

(52) U.S. Cl.
CPC .............. *H05K 2201/10166* (2013.01); *H05K 2203/0338* (2013.01); *H05K 2203/049* (2013.01)

(56) References Cited

U.S. PATENT DOCUMENTS

| | | | |
|---|---|---|---|
| 2014/0103519 A1* | 4/2014 | Steger | H01L 23/5385 257/734 |
| 2017/0118858 A1* | 4/2017 | Cheng | H05K 1/141 |
| 2017/0339798 A1* | 11/2017 | Wang | H01L 25/072 |
| 2018/0286775 A1* | 10/2018 | Kamata | H01L 24/48 |

* cited by examiner

THREE-DIMENSIONAL PACKAGING STRUCTURE AND PACKAGING METHOD OF POWER DEVICES

CROSS-REFERENCE TO RELATED APPLICATIONS

This application is a divisional of U.S. patent application Ser. No. 15/843,415, filed on Dec. 15, 2017, which claims priority to Chinese Patent Application No. 2017107724722, filed on Aug. 31, 2017, the entire contents of which are hereby incorporated by reference.

FIELD OF INVENTION

The invention relates to the field of packaging technology for power semiconductor modules, and more particularly to a three-dimensional packaging structure and a packaging method for power devices.

BACKGROUND

Power semiconductor devices, as basic components of power electronic converters, play a vital role in power electronics. With increasing demand of high power conversion capability, single discrete power semiconductor device (such as TO247 package) cannot meet requirements of the high-power application. Moreover, multiple discrete devices in parallel may result in large parasitic parameters, large volume, bad heat dissipation capability and other issues. Thus, power semiconductor module packaging technology with multi-chip in parallel has been widely used in high-power applications.

Now, with the development of semiconductor materials, especially the third generation of wide band gap semiconductor materials, the switching speed of the power devices has been improved a lot, thus make the high-frequency application more popular, which can significantly increase the power density of the converter. However, the packaging structure of most commercial power module significantly limits high-frequency application due to large stray inductance caused by interconnection of the substrates, the chips and the pins. Specifically, in a traditional power module packaging structure, electrodes are led out by power lead wire terminals, and these lead wires may increase parasitic inductances, which make the devices withstand large voltage stress in the turn-off process. Moreover, for large current rating power modules with multi-chip, there are problems of current dynamic sharing due to the asymmetrical structure.

These above mentioned problems will impact performances of the power electric converters, such as the efficiency, reliability and EMC. Thus, it is necessary to solve these problems by providing the packaging structure and the packaging method of power devices.

SUMMARY OF THE INVENTION

This invention proposed a three-dimensional packaging structure and a packaging method of power devices to addressing some technical issues in the existing power device packaging structures, including large parasitic inductance, small soldering areas, necessity of additional power terminals for connection with external circuits and low space utilization of the heatsink.

This three-dimensional packaging structure of power devices includes: a heatsink for integrating the fan, a first heat dissipation substrate, a second heat dissipation substrate, a third heat dissipation substrate, a first direct bond copper (DBC) substrate, a second DBC substrate, a third DBC substrate, power devices, a first flexible print circuit board (FPC board), a second FPC board and a third FPC board;

Above structure consists of three sub-modules connected by the first flexible FPC board;

The first heat dissipation substrate, the second heat dissipation substrate and the third heat dissipation substrate are respectively fixed on three surfaces of the heatsink. High thermal conductivity coating such as heat conduction silicone grease is coated on surfaces of the heat dissipation substrates for connection with the heatsink;

The first DBC substrate, the second DBC substrate and the third DBC substrate are respectively soldered on the three heat dissipation substrates;

The power devices include a plurality of MOSFET chips and a plurality of SBD chips, and all MOSFET chips and all SBD chips are attached to the three DBC substrates, constituting a half-bridge circuit;

The first FPC board, the second FPC board and the third FPC board are respectively soldered on the three DBC substrates. The first FPC board is used for connecting the main power circuit, the second FPC board serves as a driver connection board of upper MOSFET chips in the half-bridge circuit, and the third FPC board serves as a driving connection board of lower MOSFET chips in the half-bridge circuit.

Specifically, the power devices include: the first MOSFET chips, the second MOSFET chips, the first SBD chips and the second SBD chips;

The first MOSFET chips and the second MSOFE chips are respectively composed of six parallel MOSFET chips, and the first SBD chips and the second SBD chips are respectively composed of three parallel SBD chips;

The first MOSFET chips and the first SBD chips are connected in parallel, and the second MOSFET chips and the second SBD chips are connected in parallel; the first MOSFET chips and the second MOSFET chips are connected in series to form a half-bridge circuit.

Preferably, drain electrodes of the first MOSFET chips, cathodes of the first SBD chips and the first pad in the bottom layer of the first FPC board are soldered on the first soldering area;

Source electrodes of the first MOSFET chips and the first pad in the top layer of the first FPC board are connected by the first bonding wire. anodes of the first SBD chips and the second pad in the top layer of the first FPC board are connected by the second bonding wire, and the first pad and the second pad in the top layer of the first FPC board are connected to the second pad in the bottom layer of the first FPC board through the vias;

Drain electrodes of the second MOSFET chips, cathodes of the second SBD chips and the second pad in the bottom layer of the first FPC board are soldered on the second soldering area; source electrodes of the second MOSFET chips and the third pad in the top layer of the first FPC board are connected by the third bonding wire; anodes of the second SBD chips and the fourth pad in the top layer of the first FPC board are connected by the fourth bonding wire, in which the third pad and the fourth pad in the top layer of the first FPC board belong to the same copper foil in the top layer of the first FPC board.

The first pad in the bottom layer of the first FPC board serves as the positive electrode of the half-bridge circuit, and the copper foil in the top layer of the first FPC board serves as the negative electrode of the half-bridge circuit.

Preferably, the copper foil in the top layer, the first pad and the second pad in the bottom layer of the first FPC board serve as power terminals of the three-dimension packaging structure, and the power terminals are directly extended out from the first FPC board and connected with the external main circuit.

Preferably, each DBC substrate is a three-layer structure in which the upper and top layers are made of high-conductivity material and the intermediate layer is made of insulating heat transfer material. The top layer surface is divided into the first soldering area, the second soldering area, and the spacing between the two soldering areas. Moreover, the spacing is larger than the electrical insulation distance corresponding to the maximum working voltage of the power devices.

Preferably, the sizes of windows disposed on the first FPC board are matched with the sizes of power devices, so that the power devices can be placed on each DBC substrate from the windows in the manufacturing process. In addition, the number of the windows is the same as that of the power devices.

Preferably, the three-dimensional packaging structure further includes shells;

The shells above are connected to the first FPC board and have bottom areas which is capable of completely surrounding the first FPC board. the height of each shell is higher than that of the bonding wires;

The shells are used to cover the respective DBC substrates, the respective FPC boards and the power devices so as to protect the three-dimensional package structure;

Each shell has a hole on the front side used for injecting silicone gel, and the height of the injected silicone gel allows all the bonding wires to be submerged.

In accordance with another aspect of the invention, a packaging method of the power devices based on any one of the above aspect is provided, comprising:

(1) preparing DBC substrates and FPC boards according to the power devices packaging structure; the FPC boards are provided with windows; the number of the windows is the same as that of the power devices; the sizes of the windows are matched with the sizes of the power devices to be packaged.

(2) soldering the FPC boards on the DBC substrates, and soldering the power devices on the DBC substrates from the windows of the FPC boards;

(3) connecting electrodes of the power devices with the pads of the FPC boards by the wire bonding process;

(4) soldering the DBC substrates on the heat dissipation substrates, and adhering shells on the FPC boards;

(5) injecting insulating silicone gel into the shells, and allowing the insulating silicone gel to be solidified; and (6) fixing the heat dissipation substrates on surfaces of the heatsink.

Preferably, copper foils in the top layer of the DBC substrates prepared in step (1) are etched into two rectangular soldering areas with a 1.5 mm insulation distance.

Preferably, the step (2) specifically includes the following sub-steps:

(2.1) screen printing high temperature solder paste with the melting temperature of more than 200 degrees Celsius to the soldering areas in the upper surfaces of the DBC substrates;

(2.2) attaching the FPC boards to the right positions of the soldering area, and placing the power devices on the soldering areas in the upper surfaces of the DBC substrates through the windows of the FPC boards; and (2.3) soldering the power devices and the FPC boards on the soldering area of the DBC substrates by a vacuum reflow soldering technique.

In general, compared with the prior art, the invention has the following advantage:

(1) according to the packaging structure of the power device proposed in the invention, the half-bridge circuit structure formed by the power devices effectively reduces the length of the power loop, thereby reduces parasitic inductance of the power loop.

(2) layout of input and output terminals of the half-bridge circuit structure enables conductors on the power commutation path to be in a parallel structure and to constitute power conductor with opposite current flow direction in the commutation process. Parasitic inductance in the power commutation loop has been reduced due to mutual inductance cancellation, and thus overvoltage and oscillation in the power device switching process can be reduced.

(3) common-source inductance can be effectively reduced due to Kelvin connection of the driving signal wires; the driving signal wires are vertical to the power wires, which can further reduce the coupling effect between the driving circuit and the power circuit, so that interference of the power circuit to the driving circuit is reduced and driving stability is improved.

(4) laminated busbar structures directly extending from the FPC board serve as power terminals. This way eliminates additional power terminals and further reduces contact resistance and parasitic inductance, and also reduce cost. In addition, the laminated busbar structures can reduce the power terminals inductance by the mutual inductance cancellation.

(5) multiple parallel chips are arranged symmetrically in three sub-modules and the sub-modules have the same layout structure, which effectively solving the problem of large difference between parasitic parameters of commutation loop caused by multiple parallel chips. Additionally, high-frequency decoupling capacitors are integrated in each sub-module to inhibit voltage spikes in the switching process.

(6) by using the flexible characteristic of the FPC boards, sub-modules are arranged on three surfaces of the heatsink, thereby effectively increasing space utilization and extending layout of the external circuit board from a single direction to three directions;

(7) a forced air cooling fan for heat dissipation is integrated in the heatsink, so that the space utilization is further improved; and (8) complete soldering is adopted between the DBC substrates and the FPC boards, which greatly improving the reliability of the packaging structure.

DETAILED DESCRIPTION OF THE EMBODIMENTS

Aspects For clear understanding of the objectives, features and advantages of the invention, detailed description of the invention will be given below in conjunction with accompanying drawings and specific embodiments. It should be noted that the embodiments are only meant to explain the invention, and not to limit the scope of the invention.

In the invention, the FPC board refers to a flexible PCB which adopts materials with high insulating strength such as polyimide (the insulating strength: 100 to 300 kV/mm). With this flexible PCB, the thickness of the insulating layer can be greatly reduced, which will enhance the mutual cancellation effect, thereby reducing parasitic inductance. In addition, due to the flexible characteristic of the flexible PCB, structure space can be more flexibly utilized in more compact structure design.

According to the three-dimensional packaging structure and the packaging method of power devices proposed in the invention, a packaging structure of power devices can be obtained which has low parasitic inductance, high reliability and high space utilization and allows directly connection with external circuits.

In order to achieve the above objective, the invention provides a packaging structure including power devices, direct copper bonded substrates (i.e., DBC substrates), flexible printed circuit boards (i.e., FPC boards), bonding wires, heat dissipation substrates, decoupling capacitors, a heatsink with integrating the fan and shells, and forms a half-bridge circuit structure composed by the power devices. Specifically, this packaging structure comprises a heatsink with integrating the fan, the first heat dissipation substrate, the second heat dissipation substrate, the third heat dissipation substrate, the first DBC substrate, the second DBC substrate, the third DBC substrate power devices, the first FPC board, the second FPC board and the third FPC board.

The first heat dissipation substrate, the second heat dissipation substrate and the third heat dissipation substrate are respectively fixed on three surfaces of the heatsink and high coating such as silicone grease is coated on connection surfaces of the heat dissipation substrates and the heatsink. The first DBC substrate, the second DBC substrate and the third DBC substrate are respectively soldered on the three heat dissipation substrates, the power devices comprise a plurality of MOSFET chips and a plurality of SBD chips. Those MOSFET chips and SBD chips are attached to the three DBC substrates and constitute a half-bridge circuit.

The first FPC board, the second FPC board and the third FPC board are respectively soldered on three DBC substrates. The first FPC board is used for connecting the power loop, the second FPC board serves as the driving connection board of upper MOSFET chips in the half-bridge circuit, and the third FPC board serves as the driving connection board of lower MOSFET chips in the half-bridge circuit.

In an alternative embodiment, the three-dimension packaging structure can be applied to, but not limited to, a silicon carbide power device, a silicon-based power device or a gallium nitride power device.

The attaching positions of the power devices on the DBC substrates correspond to the windows of the FPC boards, and electrodes of the power devices and the FPC boards are connected by bonding wires.

Each FPC board has a three-layer structure in which the top layer and the bottom layer are made of copper materials, and the intermediate layer is made of insulating materials; and the copper foils in the top layer and the bottom layer are etched into the needed circuit structure.

In such a packaging structure of power devices in which the FPC boards are fixed on the DBC substrates and the power devices are attached to the DBC substrates through windows of the FPC boards and connected to the FPC boards by bonding wires, the power commutation loop of the power devices is greatly shortened. And meanwhile, there are conductive layers with opposite current directions in the commutation loop, which has mutual inductance cancellation effect and thus reduce parasitic inductance.

In a specific example, the power devices specifically include: the first MOSFET chips, the second MOSFET chips, the first SBD chips and the second SBD chips.

The first MOSFET chips and the second MOSFET chips are respectively composed by six parallel MOSFET chips, and the first SBD chip and the second SBD chip are respectively composed by three parallel SBD chips.

The first MOSFET chips and the first SBD chips are connected in parallel, and the second MOSFET chips and the second SBD chips are connected in parallel. The first MOSFET chips and the second MOSFET chips are connected in series to form a half-bridge circuit.

In a specific example, the drain electrodes of the first MOSFET chips, the cathodes of the first SBD chips and the first pad in the bottom layer of the first FPC board are soldered on the first soldering area.

The source electrodes of the first MOSFET chips and the first pad in the top layer of the first FPC board are connected together by the first bonding wires, the anodes of the first SBD chips and the second pad in the top layer of the first FPC board are connected together by the second bonding wires, and the first pad and the second pad in the top layer of the first FPC board are connected to the second pad in the bottom layer of the first FPC board through the vias.

The drain electrodes of the second MOSFET chips, the cathodes of the second SBD chips and the second pad in the bottom layer of the first FPC board are soldered on the second soldering areas; the source electrodes of the second MOSFET chips and the third pad in the top layer of the first FPC board are connected by the third bonding wires, and the anodes of the second SBD chips and the fourth pad in the top layer of the first FPC board are connected together by the fourth bonding wires, in which the third pad and the fourth pad in the top layer of the first FPC board belong to the same copper foil in the top layer of the first FPC board.

The first pad in the bottom layer of the first FPC board serves as the positive electrode of the half-bridge circuit, and the copper foil in the top layer of the first FPC board serves as the negative electrode of the half-bridge circuit.

Layout of positive and negative electrodes of the power devices and packaging structure enables conductors in the power commutation loop to be a parallel structure. Taking the lower switching MOSFET commutation loop as an example, the current flow of the wire between the positive electrode of the packaging structure and the cathode of the first SBD chip and the wire between the anode of the first SBD chip and the drain electrode of the second MOSFET chip is opposite to the current direction between the source of the second MOSFET chip and the negative electrode, which reduces parasitic inductance by mutual inductance cancellation and thus effectively reduces overvoltage and oscillation of the power devices during the switching process.

In a specific example, the copper foil in the top layer, and the first pad and the second pad in the bottom layer of the first FPC board serve as power terminals of the three-dimensional packaging structure, and the power terminals are directly extended out from the first FPC board and connected with the external main circuit.

In this way, the packaging structure can be connected to the external circuit without additional power terminals, which reduces contact resistance and parasitic inductance caused by the additional power terminals and saves cost.

In a specific example, in the above packaging structure of the power devices, Kelvin connection is adopted between the driving connection board and electrodes of the MOSFET chips, and drive signal wires connecting the drive signal terminals to gate electrodes and source electrodes of the MOSFET chips are vertical to power wires connecting source electrodes of the MOSFET chips to pads of the FPC boards, which reduces the coupling effect between the driving circuit and the power circuit, so that the interference of the power circuit to the driving circuit can be reduced and drive stability can be improved.

In a specific example, each DBC substrate is a three-layer structure in which the upper and top layers are made of high-conductivity material and the intermediate layer is made of insulating heat transfer material. The top layer surface is divided into the first soldering area and the second soldering area, and spacing between the first soldering area and the second soldering area is larger than an electrical insulation distance corresponding to the maximum working voltage of the power devices.

In a specific example, the sizes of windows disposed on the first FPC board are matched with the sizes of the power devices, so that the power devices can be placed on the respective DBC substrate from the windows in the manufacturing process, and the number of the windows is the same as that of the power devices to be packaged.

In a specific example, the three-dimension packaging structure further includes shells.

The shells are connected to the first FPC board and have bottom areas which are capable of completely surrounding the first FPC board, and the height of each shell is higher than that of the bonding wires.

The shells are used to cover the respective DBC substrates, the respective FPC boards and the power devices so as to protect the three-dimensional package structure;

Each shell has a hole on the upper side used for injecting silicone gel, and the height of the injected silicone gel allows all the bonding wires to be submerged.

In a specific example, the DBC substrate adopts double-sided copper bonded ceramic substrate, in which the upper and bottom layers adopt oxygen-free copper, and the intermediate layer adopts one of aluminum nitride, aluminum oxide, silicon nitride or beryllium oxide materials. The intermediate layer transmits heat generated by the power chips to heat dissipation surface at the bottom of the DBC substrate and provides insulation of electrical components inside the packaging module to the heatsink.

In a specific example, the DBC substrates are soldered on the heat dissipation substrates, the heat dissipation substrates are screwed on the heatsink and high thermal conductivity coating such as the heat conduction silicone grease is coated on surfaces of the heat dissipation substrates for connection with the heatsink. Sizes of the heat dissipation substrate and the heatsink are determined by the sizes of the DBC substrates to ensure reliable installation. And a groove suitable for the size of the cooling fan is disposed on the heatsink so as to facilitate integration of the cooling fan.

In a specific example, each shell has a hole used for injecting silicone gel on the upper side, and the hole has a diameter of 3 mm to 5 mm.

The invention will now be further described with reference to the accompanying drawings and specific embodiments.

Figure 1:
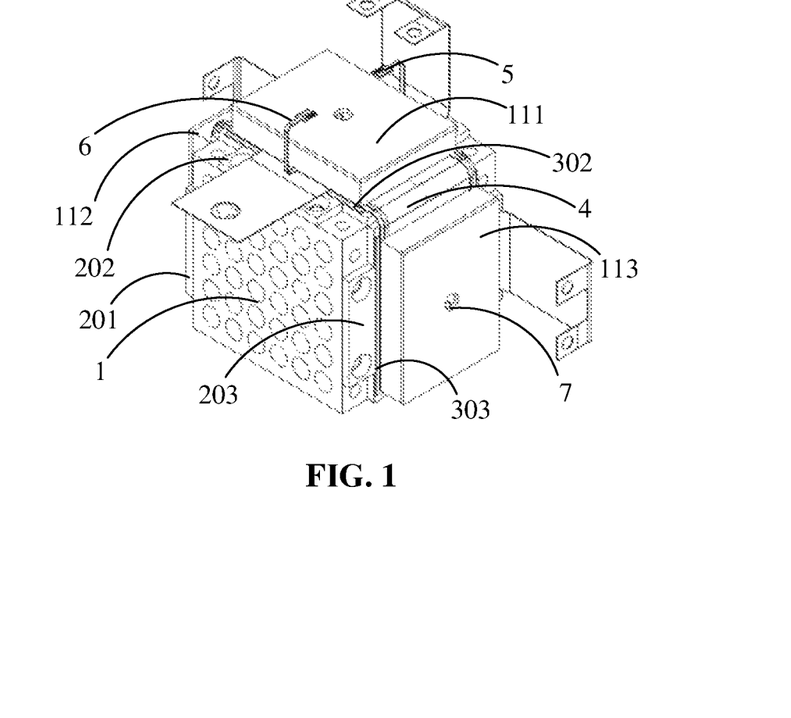
FIG. 1 is an exemplary embodiment of side view of the three-dimensional packaging structure of the power devices according to the invention.
Figure 2:
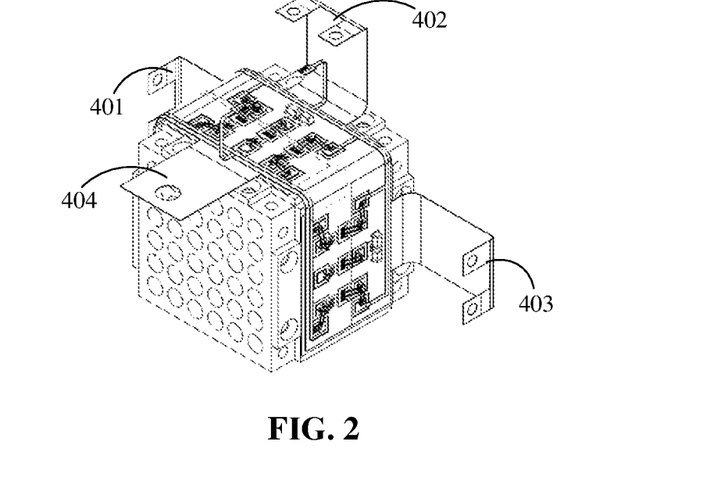
FIG. 2 is a schematic structural diagram of the three-dimensional packaging structure of the power devices without shells according to the invention.

The invention is further described below with reference to the accompanying drawings and embodiments. As shown in FIGS. 1-2, the packaging structure according to the invention includes: a heatsink 1, heat dissipation substrates (201, 202, 203), shells (111, 112, 113) and a circuit structure packaged within the shells. The circuit structure includes power terminals (11, 12, 13), signal terminals (8, 9), DBC substrates (301, 302, 303), FPC boards (4, 5, 6), MOSFET chips (20, 21, 22, 23, 24, 25, 26, 27, 28, 29, 30, 31) and SBD chips (32, 33, 34, 35, 36, 37). In the packaging structure, the heat dissipation substrates (201, 202, 203) are respectively screwed to three surfaces of the heatsink 1; the DBC substrates (301, 302, 303) are soldered on the heat dissipation substrates by high temperature reflow soldering process; the FPC boards (4, 5, 6), the MOSFET chips (20, 21, 22, 23, 24, 25, 26, 27, 28, 29, 30, 31) and the SBD chips (32, 33, 34, 35, 36, 37) are soldered on the DBC substrates (301, 302, 303) and connected by aluminum bonding wires; and the shells (111, 112, 113) are configured to protect the packaging structure and filled with silicone gel.

The shells (111, 112, 113) are adhered to the FPC board 4 through sealant, and a hole (7) with a diameter of 4 mm is formed on the front surface of each of the shells (111, 112, 113) and used for injecting the silicone gel. The shells (111, 112 113) are internally filled with silicone gel having the glass transition temperature of more than 200 degrees Celsius, and the height of the filled silicone gel allows all bonding wires to be immersed.

Figure 3:
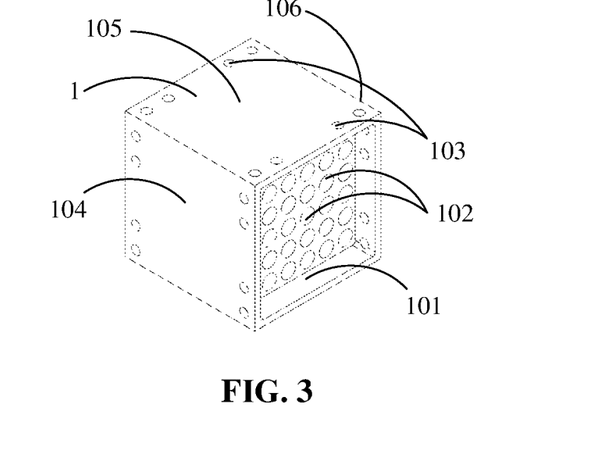
FIG. 3 is a schematic structural diagram of the heatsink according to the invention.
Figure 4:
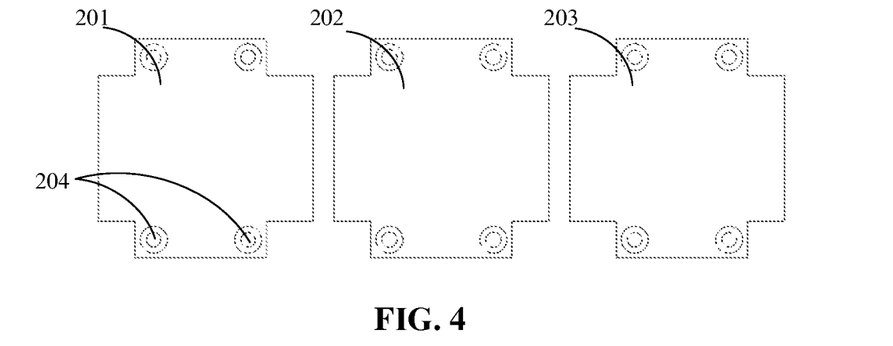
FIG. 4 is a schematic structural diagram of the heat dissipation substrates according to the invention.

FIG. 3 is the schematic structural diagram of the heatsink of the packaging structure according to the invention. FIG. 4 is the schematic structural diagram of the heat dissipation substrates of the packaging structure according to the invention. The heatsink 1 has a cubic structure, and three surfaces (104, 105, 106) thereof are respectively used as connection surfaces with the heat dissipation substrates (201, 202, 203); screw holes (13) on the heatsink 1 are used to connect the heat dissipation substrates; through holes (102) on the heatsink 1 serve as the air ducts for forced air cooling, and the number of the through holes depends on the heat dissipation effect and machining process; and the groove 101 in the heatsink 1 is used to integrate a cooling fan and the size of the groove 101 is larger than that of the cooling fan such that the cooling fan can be put into the groove 101. The sizes of the heat dissipation substrates (201, 202, 203) are larger than that of the DBC substrates and enough space is reserved for the screw holes (204). The heat dissipation substrates (201, 202, 203) are screwed to the heatsink, and the high thermal conductivity coating such as the heat conduction silicone grease is coated on surfaces of the heat dissipation substrates for connection with the heatsink.

Figure 5:
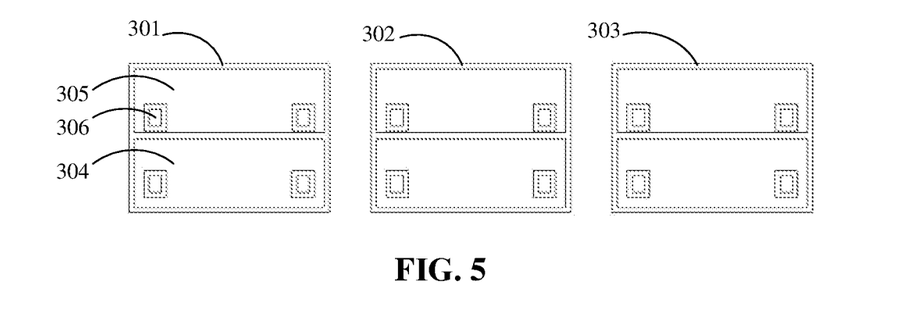
FIG. 5 is a schematic structural diagram of the DBC substrates according to the invention.

FIG. 5 is the structural diagram of the DBC substrates of the packaging structure according to the invention. As shown in FIG. 5, the DBC substrates are three identical DBC substrates (301, 302, 303), each DBC substrate is a three-layer structure in which the upper and bottom layers are both high-conductivity oxygen-free copper foils, and the intermediate layer is an aluminum nitride ceramic layer. The ceramic layer provides insulation of electrical components inside the packaging module to the heat dissipation substrates while transmitting heat generated by the power chips to the heat dissipation substrate; the copper foils (304, 305) in the top layer of the aluminum nitride ceramic substrate are etched into a circuit structure capable of providing interconnection between the power chips and the FPC board 4, in which spacing between the copper foil 304 and the copper foil 305 is 1.5 mm, and thus effective insulation distance can be provided; and the bottom layer foil of the DBC substrate can serve as a contact surface connected with the corresponding heat dissipation substrate.

Figure 6:
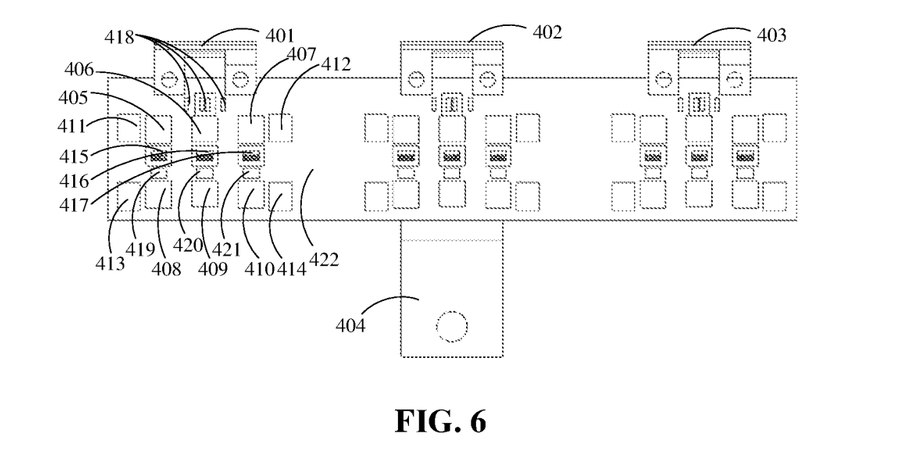
FIG. 6 is a schematic front structural diagram of the FPC board according to the invention.
Figure 7:
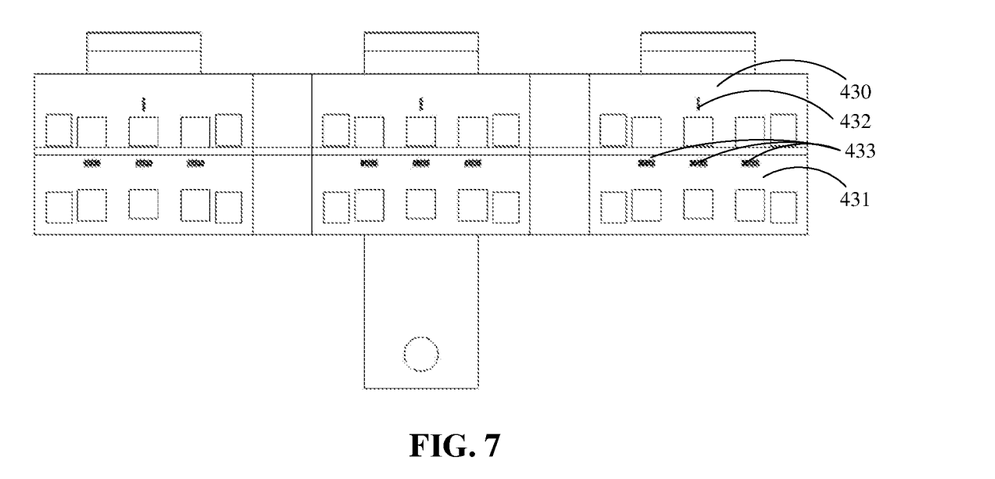
FIG. 7 is a schematic back structural diagram of the FPC board according to the invention.

FIG. 6 is the schematic front structural diagram of the FPC board according to the invention. FIG. 7 is the schematic back structural diagram of the FPC board according to the invention. The FPC boards (4, 5, 6) adopt double-layer or multilayer PCB. The FPC board 4 is used for connecting the power circuit, the FPC board 5 is used for connecting gate electrodes and source electrodes of the upper MOSFET chips in the half-bridge structure, and the FPC board 6 is used for connecting gate electrodes and source electrodes of the lower MOSFET chips in the half-bridge structure.

The FPC board 4 is divided into three same structure blocks. Taking the one-third structure on the left side of the FPC board 4 as an example, the windows (405, 407, 408, 410) have a length of 5.1 mm and a width of 5.36 mm and are used for placing the MOSFET chips (26, 27, 20, 21), the windows (406, 409) have the length of 5.08 mm and a width of 5.08 mm and are used for placing the SBD chips (32, 35); the copper foils in the top layer of the one-third structure on the left side of the FPC board 4 are subjected to film covering processing, leave six pads 415, 416, 417, 419, 420 and 421; the pads 418 in the top layer of the FPC board 4 are used for connecting the high-frequency decoupling capacitors 10; the copper foils 430 and 431 in the bottom layer of the FPC board 4 have the same structure as that of the copper foils 304 and 305 in the top layer of the DBC board 301 so as to achieve soldering with the DBC board 301; and the FPC board 4 comprises holes 433 for connecting the copper foil structures in the upper and bottom layers of the FPC board.

Figure 8:
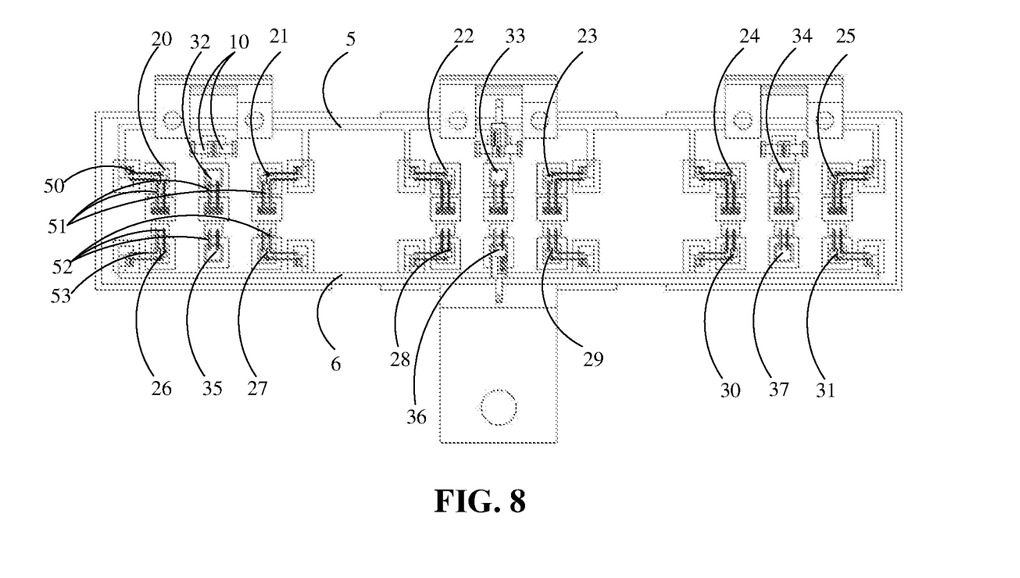
FIG. 8 is a schematic expanded view of the FPC board plus the DBC substrates according to the invention.
Figure 9:
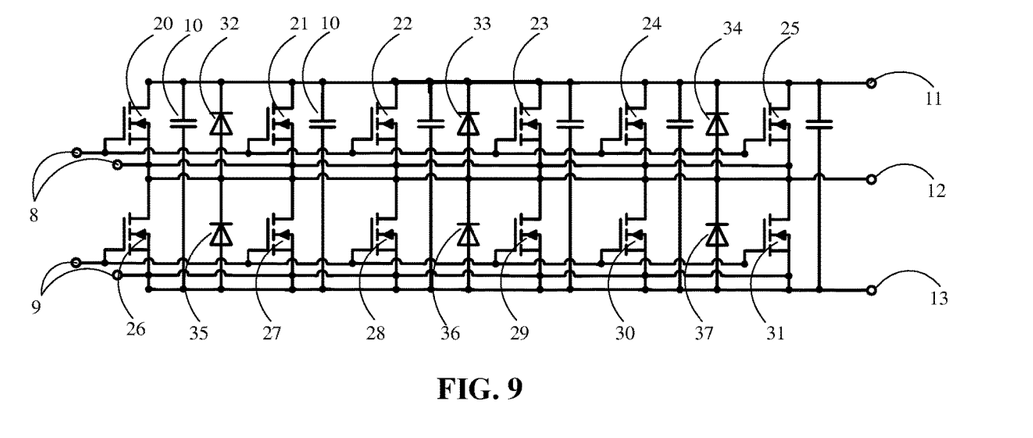
FIG. 9 is an exemplary diagram of the connection to external circuit for the three-dimensional packaging structure.

The packaging structure comprises a half-bridge circuit structure. FIG. 8 is the circuit structure packaged within the shells, and FIG. 9 is the schematic diagram of the corresponding half-bridge circuit. The half-bridge circuit structure is composed by the high-side switch and the low-side switch with respective antiparallel diodes. The high-side switch is composed of six parallel MOSFET chips (20, 21, 22, 23, 24, 25) with three antiparallel SBD chips (32, 33, 34), and the low-side switch is composed of six parallel MOSFET chips (26, 27, 28, 29, 30, 31) with three antiparallel SBD chips (35, 36, 37).

Due to symmetrical structure of the three sub-modules, the left sub-module is described as an example. In this sub-module, the drain electrodes of the MOSFET chips (20, 21) and the cathode of the parallel SBD chip 32 are soldered on the copper foil 305 in the top layer of the DBC substrate 301, and the copper foil 430 in the bottom layer of the FPC board and the copper foil 305 in the top layer of the DBC substrate 301 are soldered together to form the positive electrode power terminal 11; the source electrodes of the MOSFET chips (20, 21) and the anode of the parallel SBD chip 32 are connected to pads (415, 416, 417) of the FPC board 4 by the bonding wire 51, the pads (415, 416, 417) are connected to the copper foil 431 in the bottom layer of the FPC board through vias 433, and the copper foil 431 in the bottom layer of the FPC board and the copper foil 304 in the top layer of the DBC substrate 301 are soldered together to form the output terminal 12 in the middle point of the bridge arms; the drain electrodes of the MOSFET chips (26, 27) and the cathode of the parallel SBD chip 35 are soldered on the copper foil 304 in the top layer of the DBC substrate 301; the source electrodes of the MOSFET chips (26, 27) and the anode of the parallel SBD chip 35 are connected to the pads (419, 420, 421) of the FPC board 4 by the bonding wire 52, in which the pads (419, 420, 421) are copper foils that belong to the copper foil 422 in the top layer of the FPC board 4 after tenting processing, and the copper foil 422 in the top layer of the FPC board 4 serves as the negative electrode power terminal 13; and the decoupling capacitors 10 are soldered on the pad 418 of the FPC board and connected to the positive terminal and the negative terminal.

In the half-bridge circuit, the drain and source electrodes of the six high-side MOSFET chips are connected to the FPC board 5, the drain and source electrodes of the six low-side MOSFET chips are connected to the FPC board 6, and driving connection terminals of the high-side MOSFETs and low-side MOSFETs are respectively lead out from the FPC boards 5 and 6. As shown in FIG. 8, Kelvin connection is adopted for drive connection, and the driving signal wires 50 and 53 are vertical to the power wires 51 and 52. Such a connection mode of the signal wires shown in FIG. 8 greatly reduces parasitic inductance of the drive circuit, thereby avoiding interference caused by the common source inductance to the drive circuit. Further, the vertical arrangement of the signal wires and the power wires greatly reduces the coupling effect of the driving loop and the power loop.

According to the layout of the packaging structure of the invention, in the half-bridge circuit, the length of the commutation loop is greatly reduced. Meanwhile, in the commutation process, the power conductor have the structure in which the current flow direction is opposite and parallel to each other, which makes full use of mutual inductance cancellation technology and thus further reduces the parasitic inductance.

Figure 10:
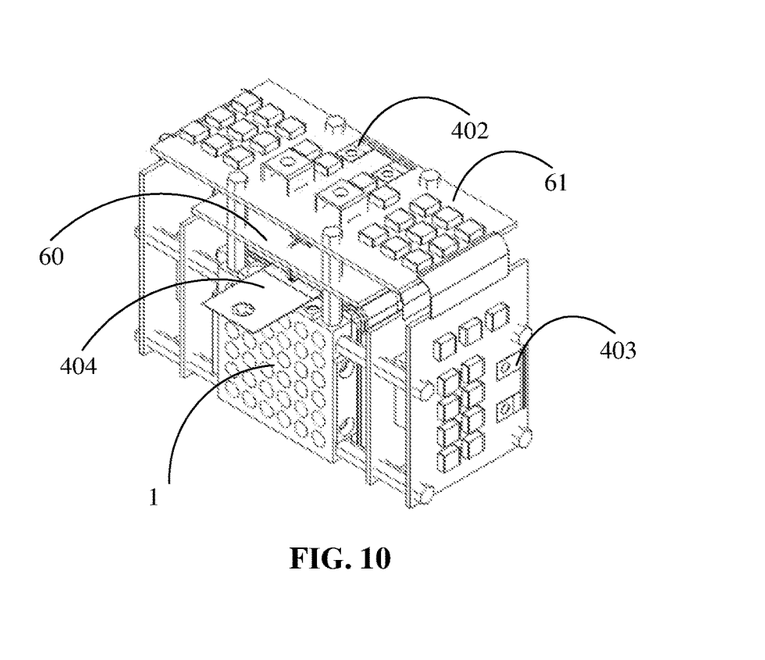
FIG. 10 is a circuit schematic diagram of the half-bridge circuit according to the invention.

FIG. 10 is an exemplary diagram of the connection mode of the packaging structure according to the invention and external circuits. In the packaging structure, the positive and negative power terminals of the half-bridge circuit are formed by three stacked busbar structures (401, 402, 403) extending from the FPC board 4, and the output terminal is formed by the copper foil 404 extending from the FPC board 4. This connection mode eliminates additional lead frame and terminals, effectively reduces contact resistance, parasitic inductance and saves cost. As shown in FIG. 10, since the packaging structure is a 3D structure, the driving board 60 and the capacitor board 61 on the direct current side can be distributed in three directions, so that space utilization can be improved.

Figure 11:
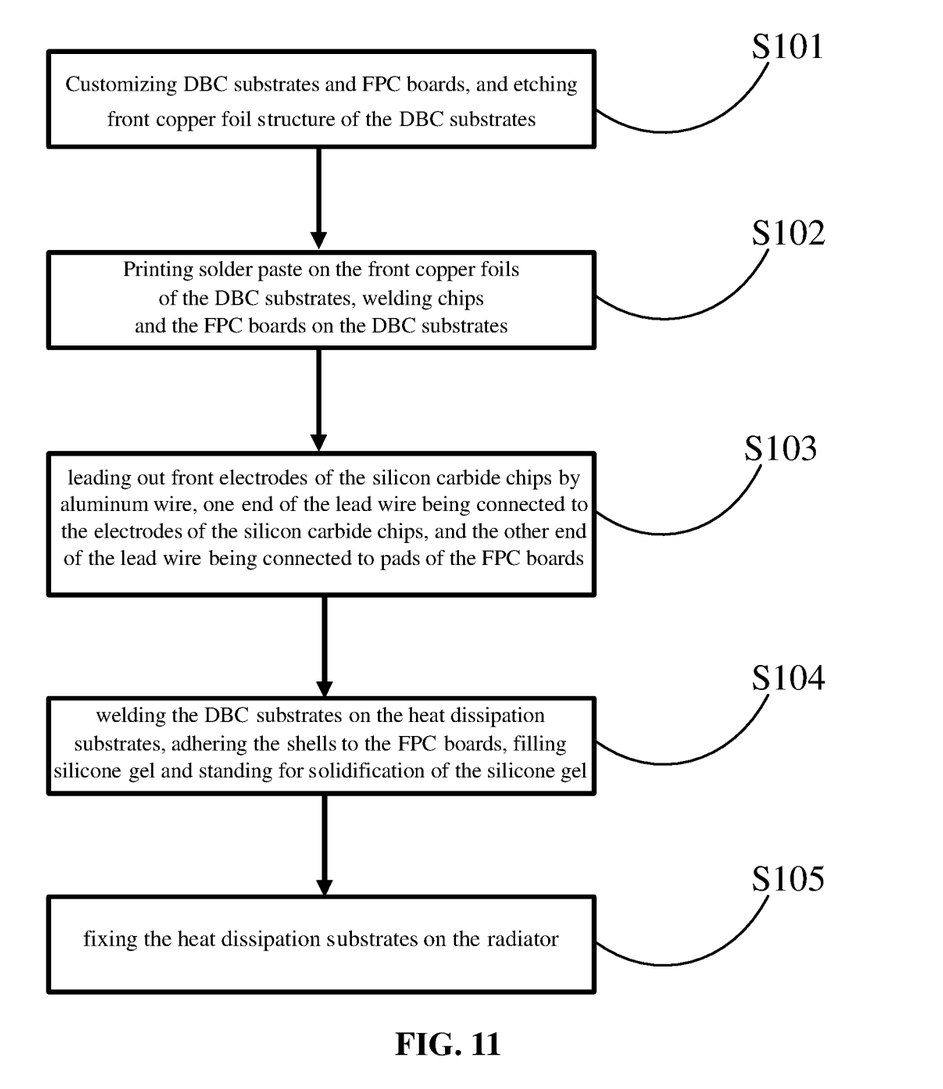
FIG. 11 is a schematic flow chart of the packaging method of the power devices according to the invention.

FIG. 11 is the flow chart of the packaging method according to the invention.

As shown in FIG. 11, the packaging method according to the invention specifically includes the following steps:

Step S101: preparing DBC substrates and FPC boards according to the packaging structure, in which the insulating layers of the DBC substrates adopt aluminum nitride (AlN) material with high thermal conductivity, and the thermal expansion coefficient of the aluminum nitride is close to that of the SiC chips; the copper foils in the top layer of the DBC substrates are etched into the circuit structure as shown in FIG. 5.

The FPC boards are provided with windows; the number of the windows is the same as that of the power devices, and the sizes of the windows are matched with the sizes of the power devices.

The copper foils in the top layer of the prepared DBC substrates are each etched into two rectangular soldering areas with a 1.5 mm insulation distance.

Particulate matter and ionic impurities on the surfaces of the DBC substrates and the FPC boards are removed by an ultrasonic cleaning method and a chemical cleaning method.

Step S102: printing solder paste on the upper copper foils of the DBC substrates, soldering the FPC boards on the DBC substrates, and soldering the power devices on the DBC substrates from the windows of the FPC boards. In the step, Sn96.5/Ag3.0/Cu0.5 solder paste with a melting point of 220 degrees Celsius is selected and screen printed on surfaces of the copper foils of the DBC substrates; and the chips and the FPC boards are soldered on the DBC substrates through the vacuum high-temperature reflow soldering technology.

Specifically, the step S102 includes the following sub-steps:

(2.1) screen printing high temperature solder paste with a melting temperature of more than 200 degrees Celsius to the soldering areas in the upper surfaces of the DBC substrates;

(2.2) attaching the FPC boards according to the positions of the soldering area, and placing the power devices on the soldering area in the upper surfaces of the DBC substrates through the windows of the FPC boards; and (2.3) soldering the power devices and the FPC boards on the soldering areas of the DBC substrates by a vacuum reflow soldering technology.

Further, the high temperature solder paste used in step (2.1) is a mixed material of tin, silver and copper with a proportion of 96.5:3:0.5 in sequence. By adopting the high temperature solder, working temperature of the packaging structure can be improved, so that stability is improved. Meanwhile, it is convenient to select solder for the packaging structure in the application process. The solder with a melting temperature of lower than 200 degrees Celsius can be adopted when the packaging structure is soldered.

Step S103: electrically connecting the electrodes of the power devices to the pads of the FPC boards by the wire bonding process.

The method of electrically connecting the power device to the FPC boards by the bonding wires process specifically includes: connecting one end of the bonding wire to the electrodes in the upper surfaces of the power device by a bonding process, and connecting the other end of the bonding wire to the pads of the FPC boards by a bonding process. Further, the number and thickness of the bonding wires can be selected according to the area of the chip electrode and the rating of current passing through the chip electrode.

Step S104: printing solder paste on the heat dissipation substrates, soldering the DBC substrates on the heat dissipation substrates and adhering the shells on the FPC boards.

Further, the low temperature solder in Step S104 is a mixed material of tin and lead with a proportion of 63:37 in sequence. Sufficient temperature difference between this low temperature solder and the high temperature solder used in step (2.1) should be ensured. For example, Pb37/Sn63 solder paste with a melting point of 183 degrees Celsius is selected and screen printed on the surfaces of the heat dissipation substrates. The DBC substrates are soldered on the heat dissipation substrates through the vacuum high-temperature reflow soldering technology. Then, shells are installed, and silicone gel is filled. The shells are adhered on the FPC boards through sealant, and have a size enabling the circuit structures of the FPC boards to be completely covered. The silicone gel is injected into the shells through a fluid dispensing method, and allowed to be solidified.

Step S105: fixing the heat dissipation substrates on the heatsink. The foregoing description and accompanying figures illustrate the principles, preferred embodiments and modes of operation of the invention. However, the invention should not be construed as being limited to the particular embodiments discussed above. Additional variations of the embodiments discussed above will be appreciated by those skilled in the art (for example, features associated with certain configurations of the invention may instead be associated with any other configurations of the invention, as desired).

While particular embodiments of the invention have been shown and described, it will be obvious to those skilled in the art that changes and modifications may be made without departing from the spirit and scope of the invention.

The invention claimed is:

1. A packaging method of power devices, comprising:
   (1) preparing DBC substrates and FPC boards according to a packaging structure; the FPC boards are provided with windows; a number of the windows is the same as that of the power devices, and sizes of the windows are matched with sizes of the power devices;
   (2) soldering the FPC boards on the DBC substrates, and at the same time soldering the power devices on the DBC substrates from the windows of the FPC boards;
   (3) electrically connecting electrodes of the power devices to pads of the FPC boards by a wire bonding process;
   (4) soldering the DBC substrates on heat dissipation substrates, and adhering shells on the FPC boards;
   (5) injecting insulating silicone gel into the shells, and allowing the insulating silicone gel to be solidified; and
   (6) fixing the heat dissipation substrates on surfaces of a heatsink,
   wherein copper foils in a top layer of the DBC substrates are each etched into two rectangular soldering areas with a 1.5 mm insulation distance, and
   wherein the step (2) includes the following sub-steps:
   (2.1) screen printing high temperature solder paste with a melting temperature of more than 200 degrees Celsius to the soldering areas in upper surfaces of the DBC substrates;
   (2.2) attaching the FPC boards according to positions of the soldering areas, and placing the power devices on the soldering areas in the upper surfaces of the DBC substrates through the windows of the FPC boards; and
   (2.3) soldering the power devices and the FPC boards on the soldering areas of the DBC substrates by a vacuum reflow soldering technology.

* * * * *